(12) United States Patent
Lagree

(10) Patent No.: US 8,735,714 B1
(45) Date of Patent: May 27, 2014

(54) DEVICE FOR DISABLING A PHOTOVOLTAIC PANEL OR ARRAY AND PHOTOVOLTAIC SYSTEM INCLUDING THE SAME

(71) Applicant: Eaton Corporation, Cleveland, OH (US)

(72) Inventor: James L. Lagree, Robinson Township, PA (US)

(73) Assignee: Eaton Corporation, Cleveland, OH (US)

( * ) Notice: Subject to any disclaimer, the term of this patent is extended or adjusted under 35 U.S.C. 154(b) by 67 days.

(21) Appl. No.: 13/684,603

(22) Filed: Nov. 26, 2012

(51) Int. Cl.
*H02H 3/00* (2006.01)

(52) U.S. Cl.
USPC .............................................. 136/251; 361/42

(58) Field of Classification Search
USPC ............................... 361/42, 44; 136/246, 251
See application file for complete search history.

(56) References Cited

U.S. PATENT DOCUMENTS

| | | |
|---|---|---|
| 2010/0071744 A1 | 3/2010 | Peurach et al. |
| 2010/0229916 A1* | 9/2010 | Bechamp ...................... 136/244 |
| 2011/0056486 A1* | 3/2011 | North .............................. 126/706 |
| 2011/0172842 A1 | 7/2011 | Makhota et al. |
| 2012/0174961 A1 | 7/2012 | Larson et al. |

FOREIGN PATENT DOCUMENTS

| | | |
|---|---|---|
| DE | 10 2008 022128 A1 | 11/2009 |
| FR | 2 961 023 A1 | 12/2011 |
| JP | H08 316509 A | 11/1996 |
| WO | 2005/071512 A1 | 8/2005 |

OTHER PUBLICATIONS

European Patent Office, "International Search Report and Written Opinion", Jan. 10, 2014, 10 pp.

* cited by examiner

*Primary Examiner* — Danny Nguyen
(74) *Attorney, Agent, or Firm* — Eckert Seamans Cherin & Mellott, LLC; Kirk D. Houser

(57) ABSTRACT

A device includes an enclosure mounted to an end portion of a photovoltaic panel and has an interior, an opening, an inclined ramp within the interior, a door pivotally disposed at the opening, and a latch mechanism. The door is on a panel surface in an open position, and blocks the opening in a closed position. The latch mechanism latches the door closed and releases the door to the open position. A flexible material blocks light from reaching panel photovoltaic cells and includes a first end coupled to the inclined ramp within the enclosure and an opposite second end coupled to a rod. The flexible material is rolled up about the rod and rests on the inclined ramp. The door's closed position blocks deployment of the material. In the open position, the material rolls down the inclined ramp and covers the panel surface. The door is automatically or manually deployed.

16 Claims, 8 Drawing Sheets

US 8,735,714 B1

DEVICE FOR DISABLING A PHOTOVOLTAIC PANEL OR ARRAY AND PHOTOVOLTAIC SYSTEM INCLUDING THE SAME

BACKGROUND

1. Field

The disclosed concept pertains generally to photovoltaic panels or arrays and, more particularly, to protection devices and systems therefor. The disclosed concept further pertains to photovoltaic systems.

2. Background Information

Power sources that generate electrical energy usually contain a mechanism to shut off the source of power when the electrical energy is no longer needed, or if there is danger of causing harm to people or equipment.

For example, an electromechanical generator has a prime source of power, such as a gas or diesel engine. In an emergency condition, the source of fuel can be turned off (e.g., by a valve) or the engine can disconnected from the generator, thereby allowing the generator to spin down, stop and cease producing energy.

For alternative energy sources, such as windmills having turbines or wind turbines to generate energy, the turbine can be disconnected from the rotor blades moving the turbine in order to stop the generation of energy. Alternatively, the rotor blades can be rotated to stop the creation of lift on the rotor blades and cause them to stop spinning, thereby stopping the turbine from spinning and creating electrical energy.

U.S. Patent Application Publication No. 2011/0172842 discloses the use of switches to shut down an attached solar module. The switches can be mechanical switches, semiconductor-type switches, such as MOSFET transistors or other similar switches, or any suitable type of switch.

U.S. Patent Application Publication No. 2010/0071744 discloses a photovoltaic (PV) installation including a PV array, an electrical interface connecting a utility power source to an electrical load, and a DC to AC inverter. A first set of wiring electrically connects the PV array to the inverter through a disconnect device and a second set of wiring electrically connects the inverter to the electrical interface. A control mechanism connects the disconnect device to the electrical interface, in order that when power from the electrical interface is removed, the PV array is electrically disconnected from the inverter. The disconnect device may be a remote disconnect device located at a position at or near the PV array, such as in the space beneath a roof supporting the PV array.

However, these proposals do not prevent photovoltaic cells from providing a potential voltage that could feed a fault between a photovoltaic panel and a first switch or disconnect device. As a result, there is an area where there is no protection. As long as the sun or another source of light is shinning on the photovoltaic or solar cells, they produce electrical energy. This is more evident when there are relatively many cells in an area and relatively long runs of cabling combine the cells to create higher voltages and/or larger current capabilities. There have been recent instances of such cells creating fires because of loose wiring or short circuits. There is also an electrocution danger to first responders to a location with cells generating electrical energy because the responders cannot completely turn off the cells.

FIG. 1 shows a photovoltaic generation and distribution system including a plurality of photovoltaic or solar cells 1, distribution wire 2, a first DC disconnect or circuit breaker 3, an inverter 4 for converting DC voltage to an AC voltage, a grid interconnection circuit breaker 5, and an electrical grid or a number of electrical loads 6. A zone of no protection 7 exists when the cells 1 are generating electrical energy. The zone of no protection 7 is where the cells 1 can produce unwanted electricity at a time when, for example, workers, firemen or first responders to an emergency are in the area. This zone of no protection 7 is also prone to relatively high current faults, arcing faults and ground faults.

FIG. 2 shows another photovoltaic generation and distribution system that is somewhat similar to the system of FIG. 1, except that it is larger, includes more photovoltaic or solar cells 1 and more distribution wire 2 to combine the multiple cells. Hence, the corresponding zone of no protection 7' has expanded with more distribution wiring and with multiple photovoltaic panels including the cells 1.

U.S. Patent Application Publication No. 2012/0174961 discloses a photovoltaic system including one or more solar panels, and one or more shuttering assemblies, each of which is configured to selectively limit the quantity of light received by one or more of the solar panels. A control module is configured to direct the one or more shuttering assemblies to reduce the quantity of light received by at least one of the one or more solar panels in response to signals indicating there is an arc fault event in the photovoltaic system. The shuttering assembly includes an elongated, opaque sheet that is biased into a wound or stowed position. The sheet is movable via a motor from the stowed position to an unwound or blocking position in which the elongated sheet extends across and substantially covers the light-receiving surface of the string of solar panels.

There is room for improvement in photovoltaic panels and arrays.

There is also room for improvement in photovoltaic systems.

SUMMARY

These needs and others are met by embodiments of the disclosed concept in which a solar shut off member comprises a flexible material sized and structured to block light from reaching photovoltaic cells of the surface of a photovoltaic panel or array. The flexible material includes a first end and an opposite second end, the first end being coupled to an inclined ramp within an enclosure, and a rod coupled to the opposite second end of the flexible material. The flexible material is rolled up about the rod and rests on the inclined ramp within the interior of the enclosure. The closed position of a door of the enclosure blocks deployment of the flexible material. In the open position of the door, the flexible material, which is rolled up about the rod, is structured to roll down the inclined ramp and cover the surface of the photovoltaic panel or array.

In accordance with one aspect of the disclosed concept, a device is for disabling a photovoltaic panel or array including an end portion and a surface having a plurality of photovoltaic cells. The device comprises: an enclosure structured to be mounted to the end portion of the photovoltaic panel or array, the enclosure comprising: a plurality of sides defining an interior and an opening, an inclined ramp contained within the interior, a door pivotally disposed at the opening, the door having an open position and a closed position, the door being structured to be disposed on the surface of the photovoltaic panel or array in the open position, the door blocking the opening in the closed position, and a latch mechanism operatively associated with the door, the latch mechanism latching the door in the closed position and releasing the door to the open position; a solar shut off member comprising: a flexible material sized and structured to block light from reaching the photovoltaic cells of the surface of the photovoltaic panel or array, the flexible material including a first end and an opposite second end, the first end being coupled to the inclined ramp within the enclosure, and a rod coupled to the opposite second end of the flexible material, wherein the flexible material is rolled up about the rod and rests on the inclined ramp within the interior of the enclosure; wherein the closed position of the door blocks deployment of the flexible material; and wherein in the open position of the door, the flexible material, which is rolled up about the rod, is structured to roll down the inclined ramp and cover the surface of the photovoltaic panel or array.

As another aspect of the disclosed concept, a photovoltaic system comprises: a photovoltaic panel or array including an end portion and a surface having a plurality of photovoltaic cells; an enclosure coupled to the end portion of the photovoltaic panel or array, the enclosure comprising: a plurality of sides defining an interior and an opening, an inclined ramp contained within the interior, a door pivotally disposed at the opening, the door having an open position and a closed position, the door being disposed on the surface of the photovoltaic panel or array in the open position, the door blocking the opening in the closed position, and a latch mechanism operatively associated with the door, the latch mechanism latching the door in the closed position and releasing the door to the open position; and a solar shut off member comprising: a flexible material sized and structured to block light from reaching the photovoltaic cells of the surface of the photovoltaic panel or array, the flexible material including a first end and an opposite second end, the first end being coupled to the inclined ramp within the enclosure, and a rod coupled to the opposite second end of the flexible material, wherein the flexible material is rolled up about the rod and rests on the inclined ramp within the interior of the enclosure; wherein the closed position of the door blocks deployment of the flexible material; and wherein in the open position of the door, the flexible material, which is rolled up about the rod, rolls down the inclined ramp and covers the surface of the photovoltaic panel or array.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

Figure 1:
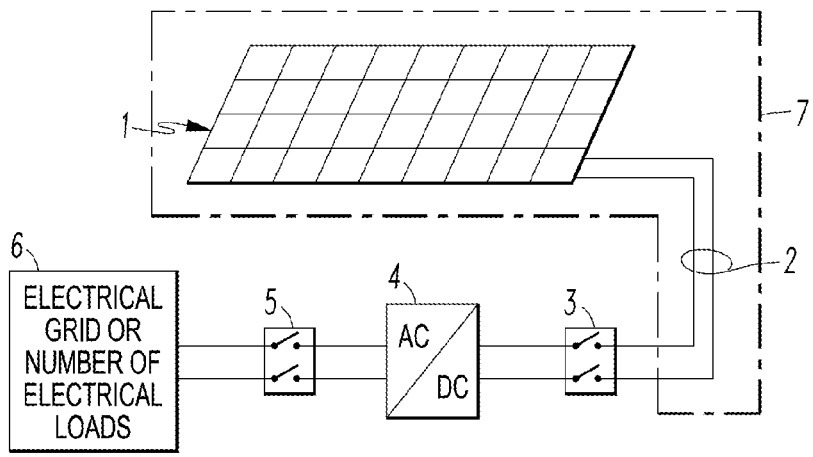
FIGS. 1 and 2 are block diagrams of photovoltaic generation and distribution systems.
Figure 2:
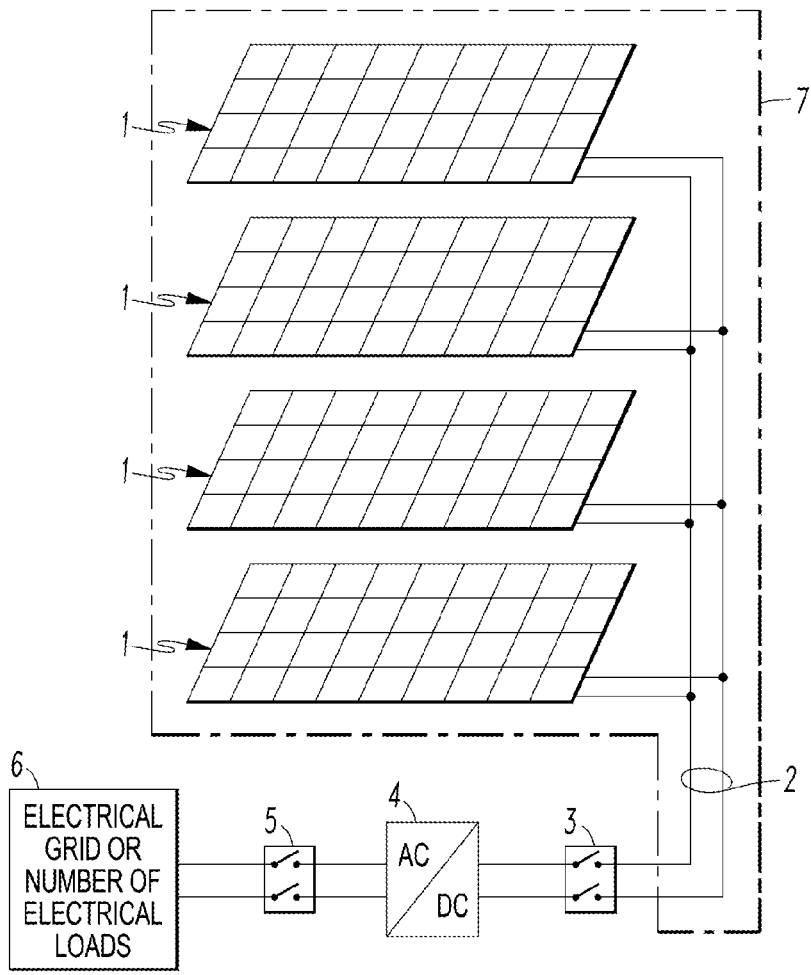
Figure 3:
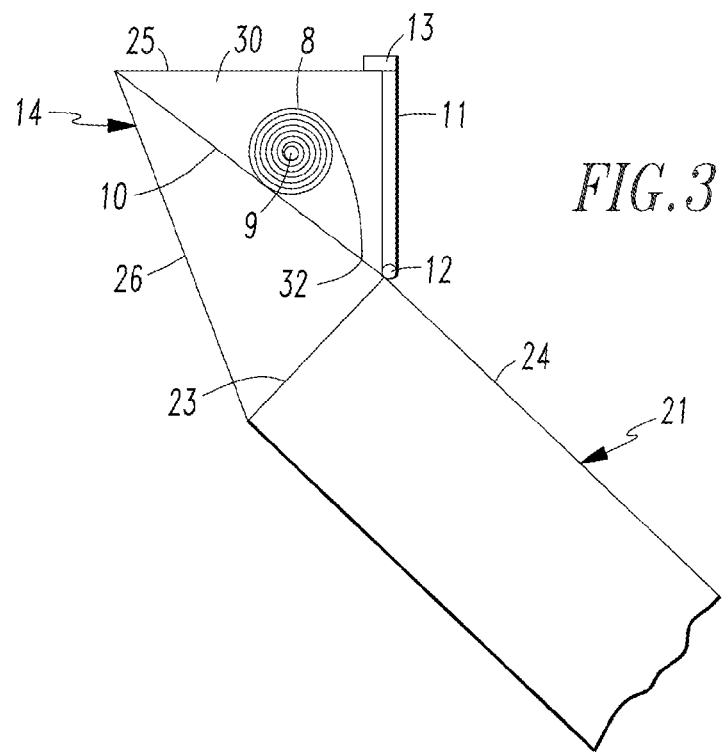
FIG. 3 is a side elevation view of an enclosure mounted on an inclined photovoltaic panel with an end panel of the enclosure being removed to show a rolled up solar shut off blanket in accordance with embodiments of the disclosed concept.

Referring to FIG. 3, an enclosure 14 is mounted on the top (with respect to FIG. 3) of an inclined photovoltaic array or panel 21. The photovoltaic panel 21 includes a plurality of photovoltaic or solar cells 22 (shown in FIGS. 4-6), each of which produces electricity when light shines thereon. The enclosure 14 has an inclined ramp 10 contained therein and a solar shut off blanket 8 rests on the inclined ramp 10. The solar shut off blanket 8 is made of a suitable material that blocks light from reaching the photovoltaic or solar cells 22 of the photovoltaic panel 21. The solar shut off blanket 8 contains a suitably weighted rod 9 at the end of the blanket 8. The weighted rod 9, as shown in FIG. 3, is initially positioned in the center of the rolled up solar shut off blanket 8 when the blanket 8 is rolled up and resting on the inclined ramp 10 within the enclosure 14.

Figure 4:
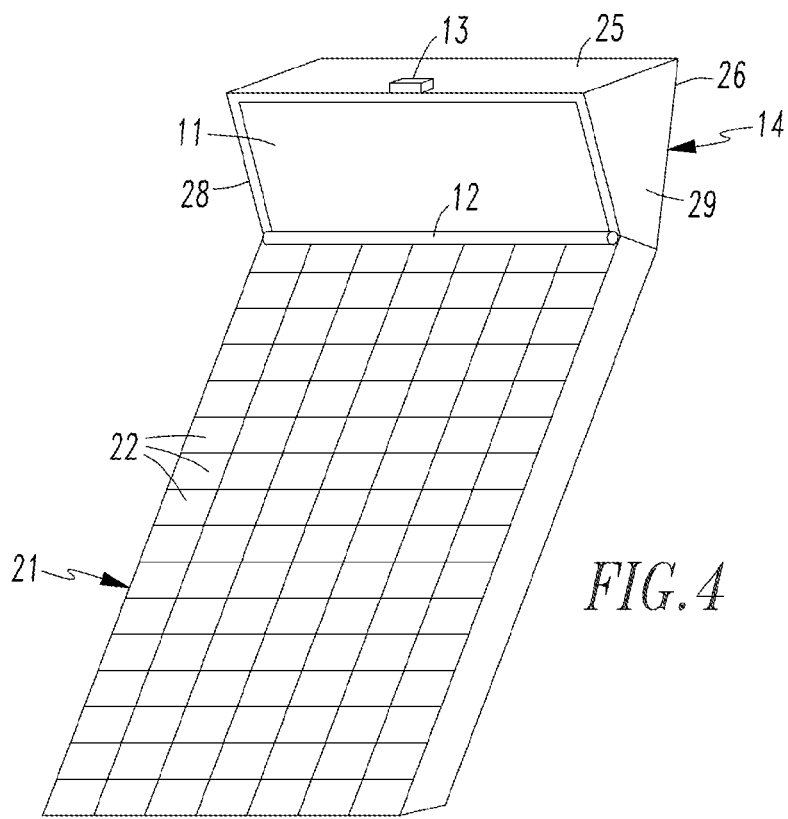
FIG. 4 is an isometric view of the enclosure and inclined photovoltaic panel of FIG. 3 with a blanket front door closed and the blanket not deployed.
Figure 5:
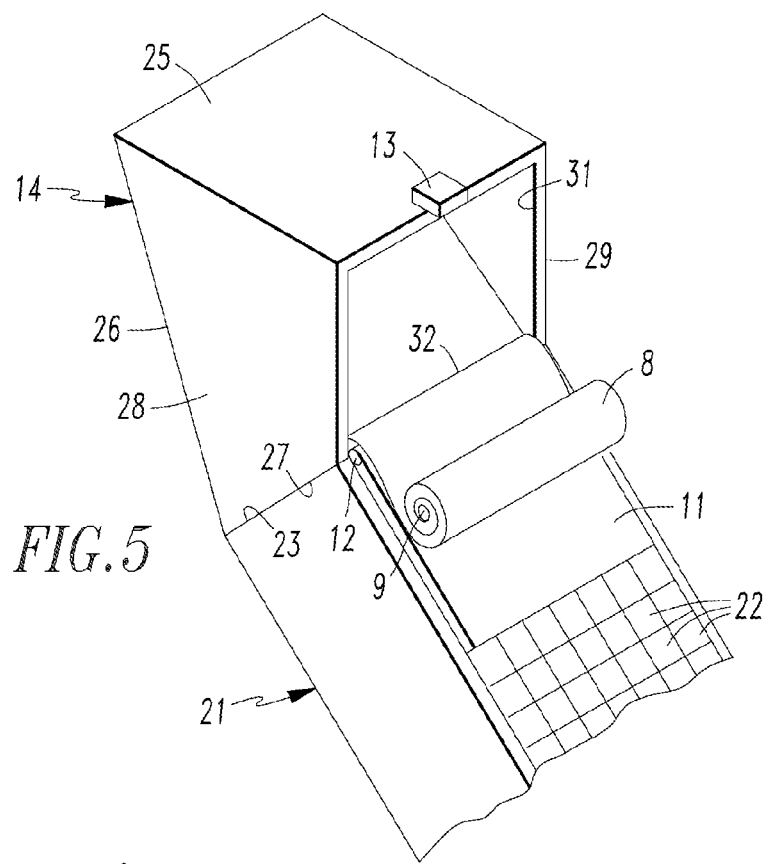
FIG. 5 is an isometric view of the enclosure and inclined photovoltaic panel of FIG. 3 with the blanket front door opened and the blanket starting to be deployed.
Figure 6:
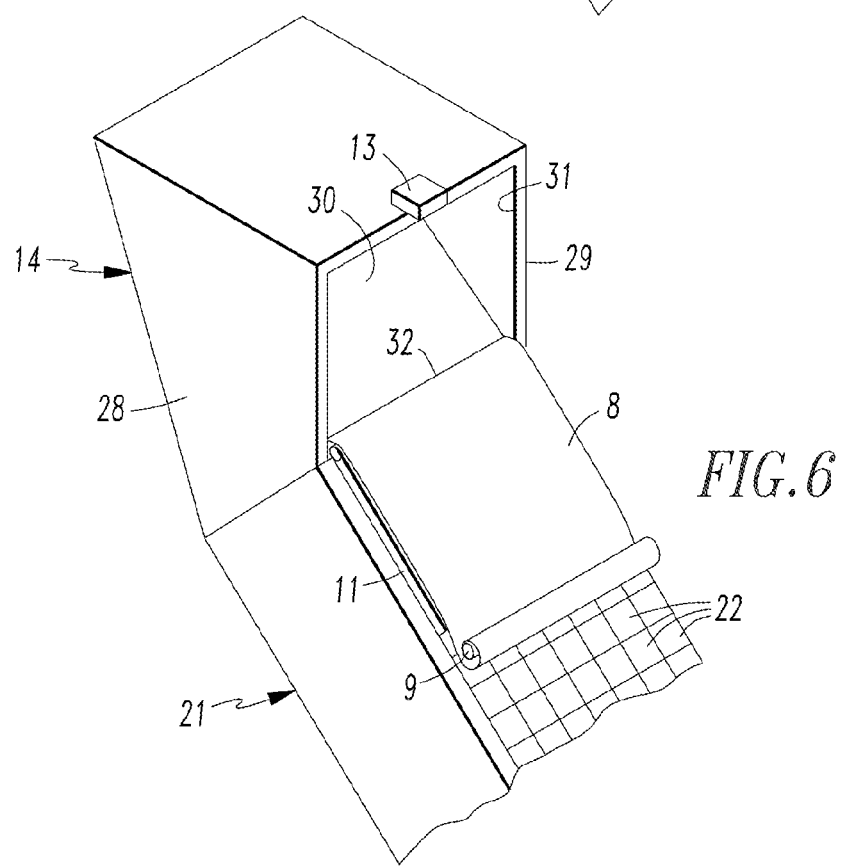
FIG. 6 is an isometric view of the enclosure and inclined photovoltaic panel of FIG. 3 with the blanket front door opened and the blanket partially deployed.

The enclosure 14 and blanket 8 form a device for disabling the photovoltaic panel 21. The photovoltaic panel 21 includes an end portion 23 and a surface 24 having the photovoltaic cells 22 (FIGS. 4-6). The enclosure 14 is mounted to the end portion 23 and includes a plurality of sides 25,26,27,28,29 defining an interior 30 and an opening 31. The inclined ramp 10 is contained within the interior 30 of the enclosure 14. A door 11 is pivotally disposed at the opening 31, and has an open position (FIG. 5) and a closed position (FIGS. 3 and 4). The door 11 is disposed on the surface 24 of the photovoltaic panel 21 in the open position, and blocks the opening 31 in the closed position. A latch 13 is operatively associated with the door 11, and latches the door 11 in the closed position and releases the door 11 to the open position.

The solar shut off blanket 8 can be made of, for example, a suitable flexible material (e.g., without limitation, a suitably thin plastic or nylon material that blocks light; a suitably tight-woven cotton material that blocks light; another suitable natural or synthetic material that blocks light) sized and structured to block light from reaching the photovoltaic cells 22 of the surface 24 of the photovoltaic panel 21. The flexible material can have, for example and without limitation, a rectangular shape with a first end 32 and an opposite second end 33. The first end 32 is suitably coupled (e.g., without limitation, an elongated, relatively thin metal or plastic bar member (not shown) runs the substantial internal length of the enclosure 14 and clamps or otherwise couples to the first end 32 of the flexible material between the bar member and the inclined ramp 10, and is capable of supporting the weight of the blanket 8 and the rod 9 when fully deployed) to the inclined ramp 10 within the enclosure 14. The weighted rod 9 is coupled to the opposite second end 33 of the flexible material. The flexible material is rolled up about the rod 9 and rests on the inclined ramp 10 within the interior 30 of the enclosure 14.

The enclosure 14 includes a front (with respect to FIG. 4; shown to the right of FIG. 3) door 11 that blocks the blanket 8 from deploying when closed. The front door 11 is pivotally coupled to the enclosure 14 by a hinge 12 located in the front, bottom (with respect to FIG. 4; shown to the right of FIG. 3) of the enclosure 14. The front door 11 is closed in the upright and closed position of FIG. 3 by the latch 13. The closed position (FIGS. 3 and 4) of the door 11 blocks deployment of the blanket 8. When the door 11 moves to the open position (FIG. 5), the flexible material of the blanket 8, which is rolled up about the rod 9, rolls down the inclined ramp 10 and covers the surface 24 of the photovoltaic panel 21. As will be described in connection with FIG. 5, the latch 13 releases the front door 11 and allows the front door 11 to open and lay on the photovoltaic or solar cells 22 of the photovoltaic panel 21.

FIG. 4 shows the enclosure 14 mounted at the top (with respect to FIG. 4) of the example photovoltaic panel 21. The blanket 8 (FIG. 3) is in a non-deployed state, the front (with respect to FIG. 4) door 11 is in the closed position, and the latch 13 is in a non-actuated, closed position.

FIG. 5 shows the blanket 8 in a just deployed mode of operation. The latch 13 on the enclosure 14 is in an actuated, open position, and the front (with respect to FIG. 4) door 11 is in the open position and lays flat on the photovoltaic or solar cells 22 on the surface 24 of the photovoltaic panel 21. In FIG. 5, the rolled up solar shut off blanket 8 of FIG. 3 is starting to be deployed down the inclined photovoltaic panel 21. The inclined ramp 10 of FIG. 3 provides the initial momentum for the rolled up solar shut off blanket 8 to start to move and unroll down the inclined photovoltaic panel 21. Gravity and the weight of the weighted rod 9 (FIG. 3) in the center of the rolled up solar shut off blanket 8 propel it down the inclined photovoltaic panel 21 and ensure full deployment (FIG. 7).

In the example embodiments, the surface 24 of the PV panel 21 is inclined, in order that gravity can further deploy the blanket 8 after the door 11 is opened. For example, for use on a pitched-roof (not shown), PV panels are typically inclined. The majority of houses have pitched-roofs, and most PV panels are also suitably pitched in order to gain more surface exposure during Winter months when the sun is relatively lower in the sky. However, if used at or near the Equator, PV panels do not need to be pitched. In that instance, sufficient pitch is provided to the inclined ramp 10 (FIG. 3) in order to provide sufficient momentum for the rolled up solar shut off blanket 8 and the weighted rod 9 to move and unroll across a flat or relatively flat PV panel (not shown).

FIG. 6 shows the blanket 8 in a partially deployed position with the front (with respect to FIG. 6) door 11 open, the latch 13 in the actuated, open position, and the solar shut off blanket 8 partially deployed about halfway down the photovoltaic panel 21.

Figure 7:
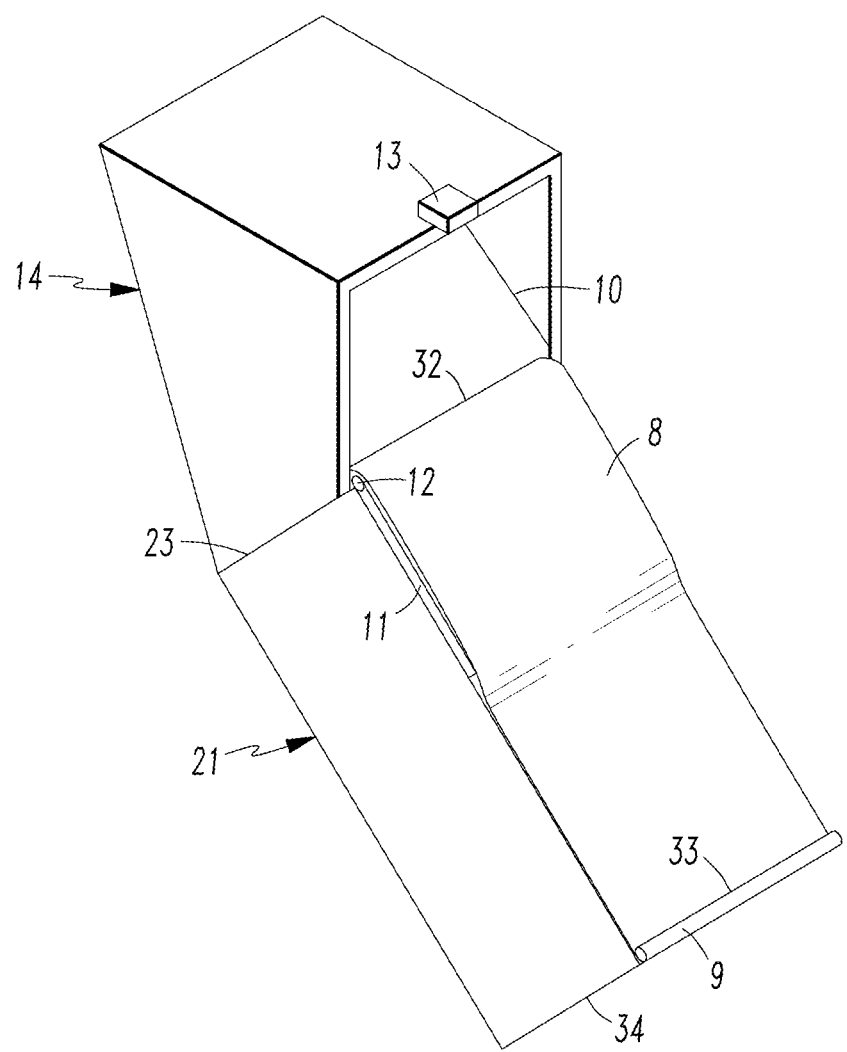
FIG. 7 is an isometric view of the enclosure and inclined photovoltaic panel of FIG. 3 with the blanket front door opened, and the blanket fully deployed and covering all of the cells to prevent solar generation of electrical energy.

FIG. 7 shows the blanket 8 in the fully deployed position. The solar shut off blanket 8 has completely unrolled and fully covers the surface 24 (FIG. 3) of the photovoltaic panel 21. The weighted rod 9 is now located at the end of the solar shut off blanket 8 at about the bottom (with respect to FIG. 7) of the photovoltaic panel 21.

The end portion 23 of the photovoltaic panel 21 is a first end portion 23 and the photovoltaic panel 21 further includes an opposite second end portion 34. The surface 24 (FIG. 3) extends between the first end portion 23 and the opposite second end portion 34 (FIG. 7). The first end portion 23 is elevated above the opposite second end portion 34, in order that the surface 24 (FIG. 3) is an inclined surface. The rod 9 coupled to the opposite second end 33 of the flexible material of the blanket 8 is weighted in order to propel the flexible material down the inclined ramp 10 and down the inclined surface 24.

The disclosed concept can be reset and reused for another occasion or event by rolling the solar shut off blanket 8 back up into the enclosure 14, closing the front (with respect to FIG. 4) door 11 and engaging the latch 13 in the non-actuated, closed position to lock the door 11 and retain the solar shut off blanket 8 (FIG. 3) within the enclosure 14. Hence, after the flexible material of the blanket 8 rolls down the inclined ramp 10 and covers the surface 24 of the photovoltaic panel 21, the flexible material can be rolled up about the rod 9 and rest on the inclined ramp 10 within the interior 30 of the enclosure 14. The door 11 is then pivoted from the open position to the closed position, and the latch 13 re-latches the door 11 in the closed position.

Figure 8:
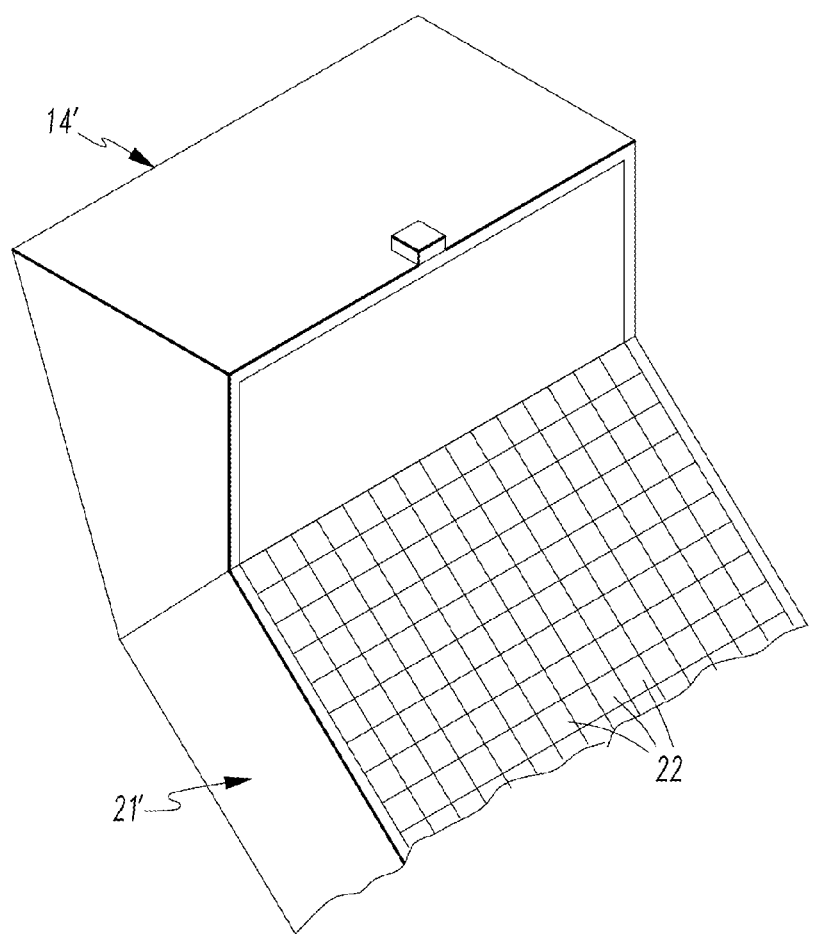
FIGS. 8 and 9 are isometric views of an enclosure for a rolled up solar shut off blanket mounted on an inclined photovoltaic panel in accordance with other embodiments of the disclosed concept.
Figure 9:
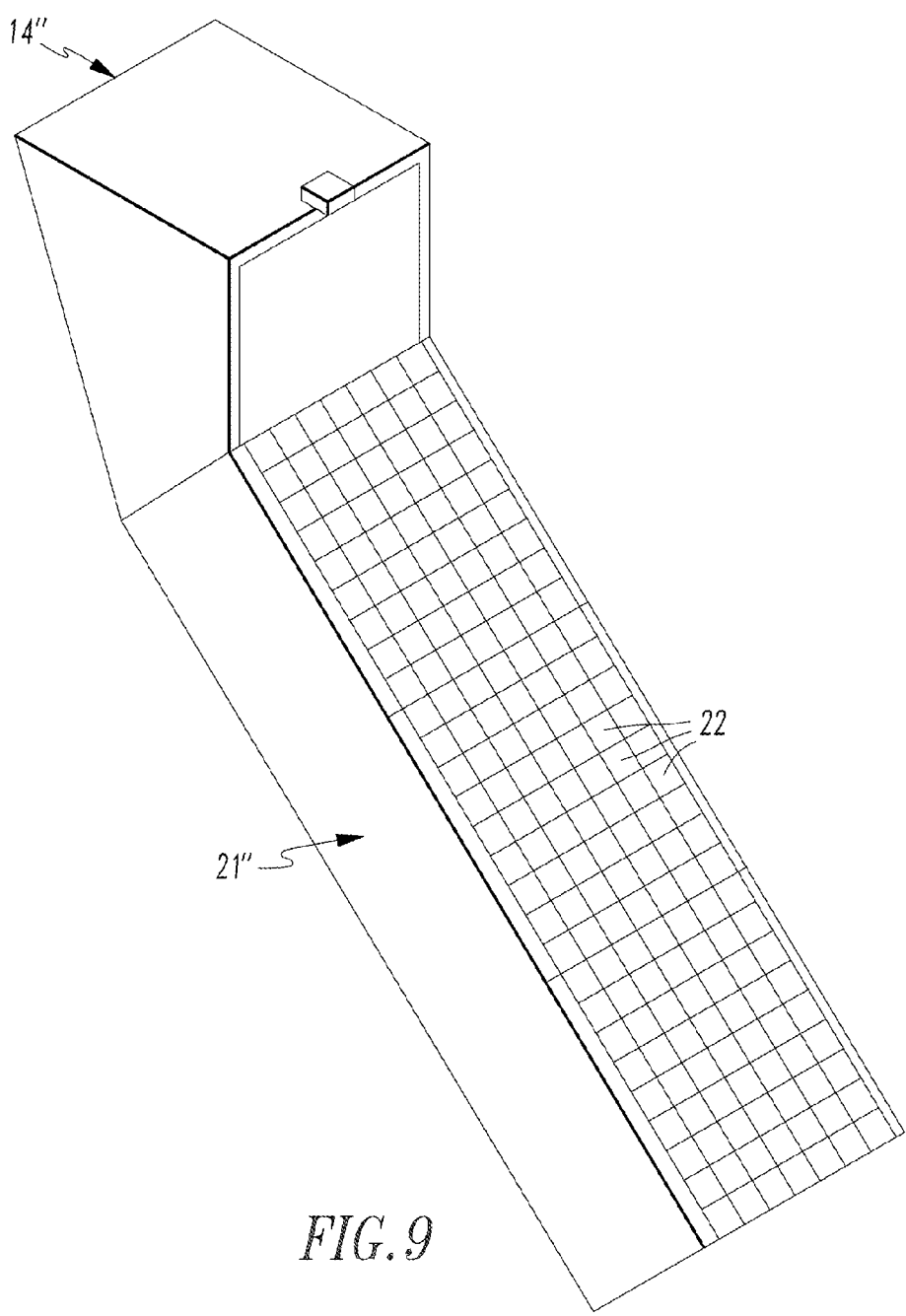

Referring to FIGS. 8 and 9, the enclosure 14 and blanket 8 of the disclosed concept can be suitably sized to fit the size and number of photovoltaic panels that it will cover. In FIG. 8, an enclosure 14' and blanket (not shown) are made relatively wider for a relatively wider photovoltaic panel 21'. In FIG. 9, enclosure 14" can be relatively larger in height and depth in order that a relatively longer solar shut off blanket (not shown) is able to roll up with a larger diameter for subsequent use with a relatively longer photovoltaic panel 21". Conversely, the disclosed concept can be connected side-by-side to cover a plurality of photovoltaic panels connected side-by-side (not shown).

The disclosed photovoltaic panels 21,21',21" can include a number of photovoltaic panels, with the flexible material of the blanket 8 being sized and structured to cover the surface, such as 24 of FIG. 3, of the number of photovoltaic panels. The interior 30 (FIGS. 3 and 6) of the enclosures 14,14',14" is sized and structured to enclose the flexible material, which is rolled up about the rod 9.

Figure 10:
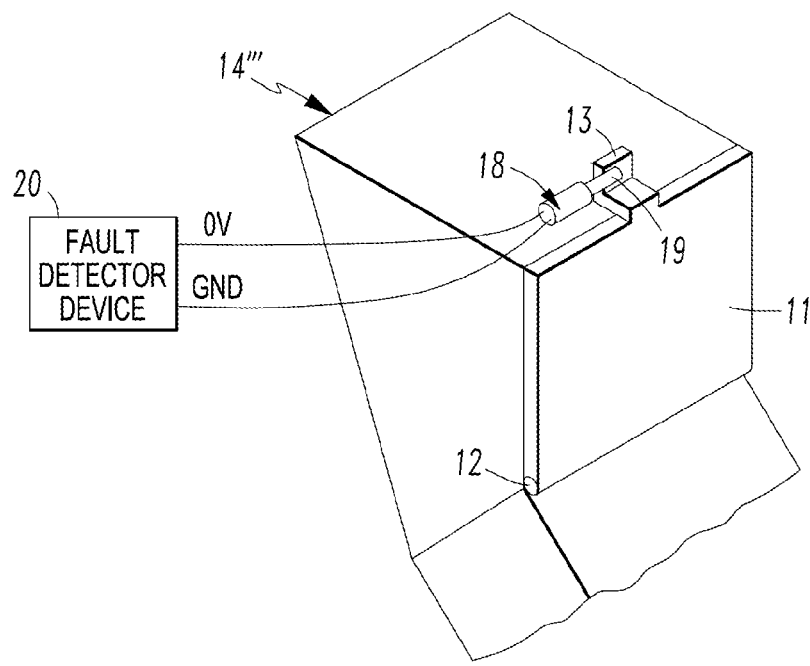
FIG. 10 is an isometric view of an enclosure for a rolled up solar shut off blanket for a photovoltaic panel using an electrical solenoid to hold the enclosure door closed in accordance with another embodiment of the disclosed concept.
Figure 11:
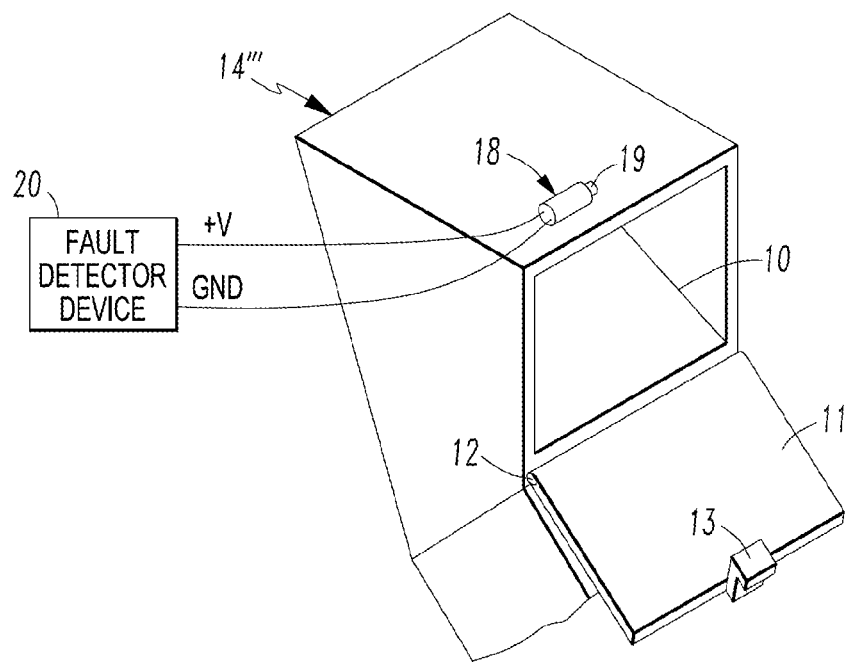
FIG. 11 is an isometric view of the enclosure of FIG. 10 with the electrical solenoid in the actuated state to release a latch of the enclosure door to open the same and deploy the rolled up solar shut off blanket.

The disclosed weighted rod 9 advantageously restricts the solar shut off blanket 8 from moving under relatively windy conditions. The disclosed concept can also be configured with variations of the latch 13 (FIGS. 3-7) or other suitable mechanisms for latching and releasing the front door 11. Referring to FIGS. 10 and 11, enclosure 14''' includes an electro-mechanical mechanism 18 structured to be energized to release the door 11 to the open position. The electro-mechanical mechanism 18 can be a solenoid 18, which is electrically energized to move a plunger 19 that allows the latch 13 on the front door 11 to disengage. When the solenoid 18 is not energized (FIG. 10), the plunger 19 engages the latch 13, which latches the door 11 in the closed position. When the solenoid 18 is energized (FIG. 11), the plunger 19 releases the latch 13, which releases the door 11 to the open position.

When the latch 13 is actuated to be open, the weight of the front door 11 and/or the weight and force of the rolled up solar shut off blanket 8 pushes the front door 11 open and deploys the solar shut off blanket 8. When the solar shut off blanket 8 is rolled back up and placed back in the enclosure 14''', the front door 11 is closed and locked back in place by removing power to the solenoid 18. Power for operation of the solenoid 18 can come from any suitable power source (e.g., without limitation, any number of photovoltaic panels; electric utility power sources; batteries). Various mechanisms can be employed to actuate the solenoid 18, to parallel a plurality of solenoids, or to actuate different banks or panels of photovoltaic panels.

The solenoid 18 of FIGS. 10 and 11 can be actuated by a suitable fault detector device 20, such as an arc fault detector, a ground fault detector and/or an overcurrent detector, structured to determine an electrical fault operatively associated with the PV panel 21 (FIGS. 3-7). In this manner, not only owners, repairmen or first responders can manually disable the PV panel 21 (FIGS. 3-7), but also a suitable fault detection system can automatically disable the PV panel 21. Examples of direct current (DC) arc fault circuit interrupters (AFCIs) and arc fault detectors for PV power systems are disclosed by U.S. Pat. No. 8,218,274, which is incorporated by reference herein.

Figure 12:
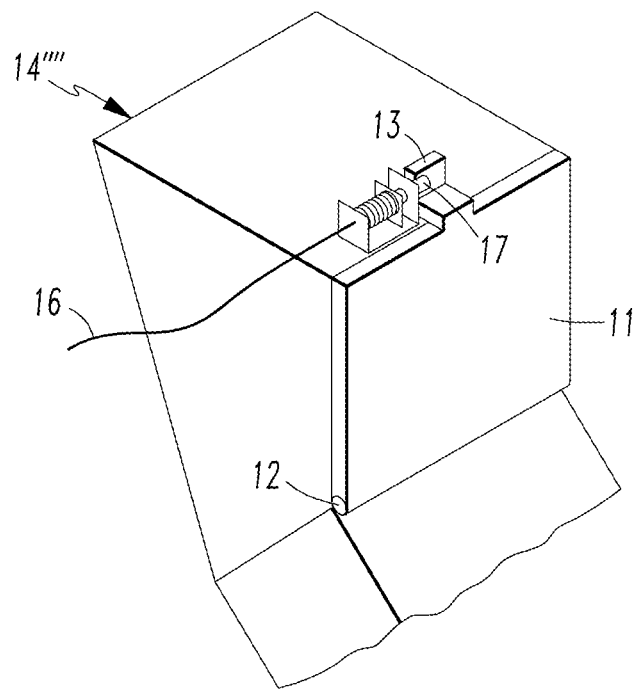
FIG. 12 is an isometric view of an enclosure for a rolled up solar shut off blanket for a photovoltaic panel using a mechanical pin to hold the enclosure door closed in accordance with another embodiment of the disclosed concept.
Figure 13:
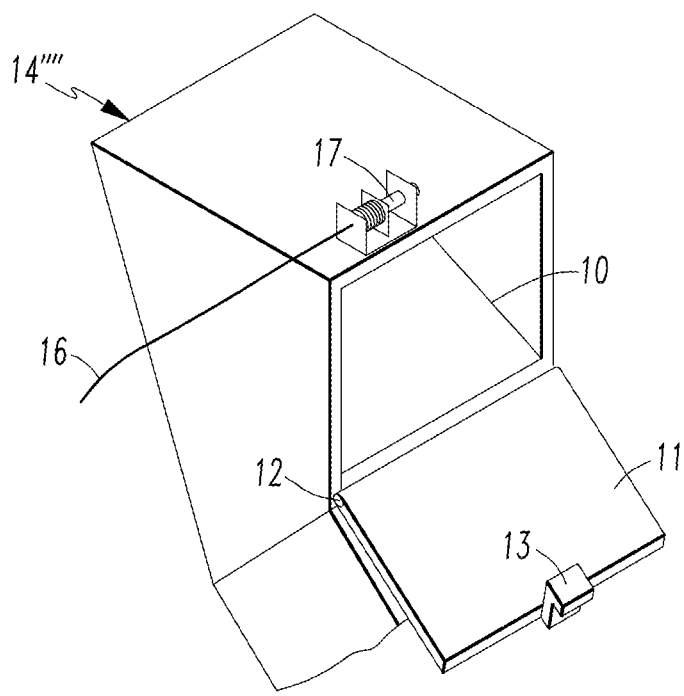
FIG. 13 is an isometric view of the enclosure of FIG. 12 with the mechanical pin in a pulled or actuated state to release a latch of the enclosure door to open the same and deploy the rolled up solar shut off blanket.

FIGS. 12 and 13 show enclosure 14'''' including a manual mechanical mechanism for unlatching the front door 11 with a pin 17 and manually releasing the door 11 to the open position. A suitable rope, wire, line or tether 16 is coupled to the pin 17 that holds the front door 11 in the closed position. When the tether 16 is not manually pulled, the pin 17 engages the latch 13, which latches the door 11 in the closed position (FIG. 12). By manually pulling the tether 16 (FIG. 13), the pin 17 retracts from and releases the latch 13, which releases the front door 11 to swing open and lay down on the PV panel 21 (FIG. 5) in the open position, thereby deploying the solar shut off blanket 8 (FIG. 7). The pin 17 is reinserted in the latch 13 if and when it is desired to reset the disclosed concept for another event.

The disclosed concept prevents light from reaching photovoltaic cells to prevent the generation unwanted electrical energy. For example, the prevention of light to photovoltaic cells in a photovoltaic panel or array can be actuated from a central or remote location by a first responder when there is an emergency in order to make the area safe for people and equipment. The disclosed concept provides a low cost, reliable, and resettable mechanism to completely eliminate the creation of electricity from photovoltaic cells.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A device for disabling a photovoltaic panel or array including an end portion and a surface having a plurality of photovoltaic cells, said device comprising:
   an enclosure structured to be mounted to the end portion of said photovoltaic panel or array, said enclosure comprising:
      a plurality of sides defining an interior and an opening,
      an inclined ramp contained within the interior,
      a door pivotally disposed at the opening, said door having an open position and a closed position, said door being structured to be disposed on the surface of said photovoltaic panel or array in the open position, said door blocking the opening in the closed position, and
   a latch mechanism operatively associated with said door, said latch mechanism latching said door in the closed position and releasing said door to the open position;
   a solar shut off member comprising:
      a flexible material sized and structured to block light from reaching the photovoltaic cells of the surface of said photovoltaic panel or array, said flexible material including a first end and an opposite second end, the first end being coupled to the inclined ramp within the enclosure, and
      a rod coupled to the opposite second end of said flexible material,
   wherein said flexible material is rolled up about the rod and rests on the inclined ramp within the interior of said enclosure;
   wherein the closed position of said door blocks deployment of said flexible material; and
   wherein in the open position of said door, said flexible material, which is rolled up about the rod, is structured to roll down the inclined ramp and cover the surface of said photovoltaic panel or array.

2. The device of claim 1 wherein the surface of said photovoltaic panel or array is an inclined surface.

3. The device of claim 1 wherein said photovoltaic panel or array includes a number of photovoltaic panels; wherein said flexible material is sized and structured to cover the surface of said number of photovoltaic panels; and wherein the interior of said enclosure is sized and structured to enclose said flexible material, which is rolled up about the rod.

4. The device of claim 1 wherein said latch mechanism includes an electro-mechanical mechanism structured to be energized to release said door to the open position.

5. The device of claim 4 wherein said electro-mechanical mechanism is a solenoid including a plunger; wherein said door includes a latch member; wherein when said solenoid is not energized said plunger engages said latch member, which latches said door in said closed position; and wherein when said solenoid is energized said plunger releases said latch member, which releases said door to said open position.

6. The device of claim 4 wherein said latch mechanism further includes a fault detector device structured to determine an electrical fault operatively associated with said photovoltaic panel or array.

7. The device of claim 6 wherein said fault detector device is selected from the group consisting of an arc fault detector, a ground fault detector, and an overcurrent detector.

8. The device of claim 1 wherein said latch mechanism includes a manual mechanism structured to manually release said door to said open position.

9. The device of claim 1 wherein said latch mechanism includes a rope, wire, line or tether coupled to a pin; wherein said door includes a latch member; wherein when said rope, wire, line or tether is not manually pulled, said pin engages said latch member, which latches said door in said closed position; and wherein when said rope, wire, line or tether is manually pulled, said pin releases said latch member, which releases said door to said open position.

10. The device of claim 1 wherein said door is pivotally coupled to said enclosure at the opening by a hinge.

11. A photovoltaic system comprising:
   a photovoltaic panel or array including an end portion and a surface having a plurality of photovoltaic cells;
   an enclosure coupled to the end portion of said photovoltaic panel or array, said enclosure comprising:
      a plurality of sides defining an interior and an opening, an inclined ramp contained within the interior, a door pivotally disposed at the opening, said door having an open position and a closed position, said door being disposed on the surface of said photovoltaic panel or array in the open position, said door blocking the opening in the closed position, and a latch mechanism operatively associated with said door, said latch mechanism latching said door in the closed position and releasing said door to the open position; and a solar shut off member comprising:

a flexible material sized and structured to block light from reaching the photovoltaic cells of the surface of said photovoltaic panel or array, said flexible material including a first end and an opposite second end, the first end being coupled to the inclined ramp within the enclosure, and a rod coupled to the opposite second end of said flexible material, wherein said flexible material is rolled up about the rod and rests on the inclined ramp within the interior of said enclosure;

wherein the closed position of said door blocks deployment of said flexible material; and wherein in the open position of said door, said flexible material, which is rolled up about the rod, rolls down the inclined ramp and covers the surface of said photovoltaic panel or array.

12. The photovoltaic system of claim 11 wherein the end portion of said photovoltaic panel or array is a first end portion; wherein said photovoltaic panel or array further includes an opposite second end portion; wherein the surface extends between the first end portion and the opposite second end portion; wherein the first end portion is elevated above the opposite second end portion, in order that the surface is an inclined surface; and wherein said rod coupled to the opposite second end of said flexible material is weighted in order to propel said flexible material down said inclined ramp and down said inclined surface.

13. The photovoltaic system of claim 12 wherein after said flexible material rolls down the inclined ramp and covers the surface of said photovoltaic panel or array, said flexible material is structured to be rolled up about the rod and rest on the inclined ramp within the interior of said enclosure; wherein said door is structured to be pivoted from the open position to the closed position; and wherein said latch mechanism is structured to re-latch said door in the closed position.

14. The photovoltaic system of claim 11 wherein said latch mechanism includes an electro-mechanical mechanism structured to be energized to release said door to the open position.

15. The photovoltaic system of claim 14 wherein said latch mechanism further includes a fault detector device structured to determine an electrical fault operatively associated with said photovoltaic panel or array.

16. The photovoltaic system of claim 15 wherein said fault detector device is selected from the group consisting of an arc fault detector, a ground fault detector, and an overcurrent detector.

* * * * *